(12) United States Patent
Qu et al.

(10) Patent No.: US 12,339,709 B2
(45) Date of Patent: *Jun. 24, 2025

(54) ELECTRONIC DEVICE

(71) Applicant: BEIJING XIAOMI MOBILE SOFTWARE CO., LTD., Beijing (CN)

(72) Inventors: Tongxun Qu, Beijing (CN); Jieming Yang, Beijing (CN); Yuwen Wang, Beijing (CN)

(73) Assignee: BEIJING XIAOMI MOBILE SOFTWARE CO., LTD., Beijing (CN)

( * ) Notice: Subject to any disclaimer, the term of this patent is extended or adjusted under 35 U.S.C. 154(b) by 196 days.

This patent is subject to a terminal disclaimer.

(21) Appl. No.: 18/213,718

(22) Filed: Jun. 23, 2023

(65) Prior Publication Data

US 2024/0288907 A1 Aug. 29, 2024

(30) Foreign Application Priority Data

Feb. 24, 2023 (CN) .......................... 202310206029.4

(51) Int. Cl.
*G06F 1/16* (2006.01)
*H04M 1/02* (2006.01)

(52) U.S. Cl.
CPC .......... *G06F 1/1656* (2013.01); *G06F 1/1616* (2013.01); *G06F 1/1652* (2013.01);
(Continued)

(58) Field of Classification Search
CPC .... G06F 1/1656; G06F 1/1616; G06F 1/1652; G06F 1/1637; G06F 1/1635;
(Continued)

(56) References Cited

U.S. PATENT DOCUMENTS 9,736,931 B2 * 8/2017 Eom .................. H05K 1/028
2014/0240933 A1 * 8/2014 Lee .................. G06F 1/1656
29/831

(Continued)

FOREIGN PATENT DOCUMENTS

CN 209376124 U 9/2019
CN 212255875 U 12/2020
(Continued)

OTHER PUBLICATIONS

Japanese Patent Application No. 2023-102908, Office Action dated Feb. 13, 2024, 6 pages.
(Continued)

*Primary Examiner* — Abhishek M Rathod
(74) *Attorney, Agent, or Firm* — Cozen O'Connor

(57) ABSTRACT

An electronic device includes a display screen, a first support plate and a flexible circuit board. The display screen includes an array substrate, the array substrate includes a substrate body and a bent part connected with a first side surface of the substrate body, and the bent part is bent towards a non-display side of the display screen. The first support plate is connected with the substrate body and cooperates with a part of the substrate body to define a first accommodating cavity, and the bent part is partially located in the first accommodating cavity. The flexible circuit board is arranged in the first accommodating cavity, connected with and in conduction with the bent part, and includes a plurality of layered regions, and the number of wiring layers in each layered region is different from the numbers of wiring layers in other layered regions.

15 Claims, 5 Drawing Sheets

(52) U.S. Cl.
CPC ....... *H04M 1/0216* (2013.01); *H04M 1/0262* (2013.01); *H04M 1/0268* (2013.01); *H04M 1/0277* (2013.01)

(58) Field of Classification Search
CPC ...... G06F 1/1626; H05K 1/028; H05K 1/147; H05K 1/189; H05K 5/0017; H05K 5/02; H05K 5/0217
See application file for complete search history.

(56) References Cited

U.S. PATENT DOCUMENTS

| | | | |
|---|---|---|---|
| 2018/0097275 A1* | 4/2018 | Lee | G06F 1/1635 |
| 2020/0043382 A1* | 2/2020 | Isa | G06F 1/1626 |
| 2022/0248534 A1* | 8/2022 | Shi | H05K 1/028 |

FOREIGN PATENT DOCUMENTS

| | | |
|---|---|---|
| CN | 216927656 U | 7/2022 |
| CN | 115083291 A | 9/2022 |
| JP | 2007207782 A | 8/2007 |
| KR | 20190067798 A | 6/2019 |
| KR | 20210092095 A | 7/2021 |
| WO | WO 2018078487 A1 | 5/2018 |

OTHER PUBLICATIONS

Japanese Patent Application No. 2023-102908, English translation of Office Action dated Feb. 13, 2024, 9 pages.
European Patent Application No. 23181539.0, Search and Opinion dated Dec. 20, 2023, 11 pages.
Korean patent application No. 10-2023-0079518, Office Action dated Oct. 18, 2024, 7 pages.
Korean patent application No. 10-2023-0079518, English translation of Office Action dated Oct. 18, 2024, 8 pages.

* cited by examiner

ELECTRONIC DEVICE

CROSS-REFERENCE TO RELATED APPLICATION

This application is based on and claims priority to Chinese Patent Application No. 202310206029.4 filed on Feb. 24, 2023, the entire contents of which are incorporated herein by reference for all purposes.

BACKGROUND

With the development of terminal technology in electronic device, the level of intelligence and integration of the device also improves. As the level of intelligence improves, power consumption of the internal modules increases which, in turn, causes increased demand for battery capacity in order to enhance the endurance time of the device.

SUMMARY

The present disclosure relates to a field of terminals, and more particularly to an electronic device.

According to an embodiment of the present disclosure, there is provided an electronic device. The electronic device includes a display screen, a first support plate and a flexible circuit board. The display screen includes an array substrate, the array substrate includes a substrate body and a bent part connected with a first side surface of the substrate body, and the bent part is bent towards a non-display side of the display screen. The first support plate is connected with the substrate body and cooperates with a part of the substrate body to define a first accommodating cavity, and the bent part is partially located in the first accommodating cavity. The flexible circuit board is arranged in the first accommodating cavity, connected with and in conduction with the bent part, and includes a plurality of layered regions, and the number of wiring layers in each layered region is different from the numbers of wiring layers in other layered regions.

It is to be understood that both the foregoing general description and the following detailed description are illustrative and explanatory only and are not restrictive of the present disclosure.

BRIEF DESCRIPTION OF DRAWINGS

The accompanying drawings, which are incorporated in and constitute a part of the specification, illustrate embodiments consistent with the present disclosure and serve to explain the principle of the disclosure together with the description.

DETAILED DESCRIPTION

Here, exemplary embodiments will be described in detail, examples of which are shown in the accompanying drawings. When the following description refers to the drawings, unless otherwise indicated, the same numbers in different drawings indicate the same or similar elements. The implementations described in the following exemplary embodiments do not represent all the implementations consistent with the present disclosure. Rather, they are merely examples of devices and methods consistent with some aspects of the present disclosure as detailed in the appended claims.

The terms used in the present disclosure are for the purpose of describing specific embodiments only and are not intended to limit the present disclosure. The singular forms "a", "said" and "the" used in the present disclosure and the appended claims are also intended to include the plural forms, unless the context clearly indicates other meaning. It should also be understood that the term "and/or" as used herein refers to and includes any or all possible combinations of one or more associated listed items.

It should be understood that terms such as "first", "second" and "third" are used herein for the purpose of describing various information, but such information should not be limited to these terms. These terms are only used to distinguish the same type of information from each other. For example, without departing from the scope of the present disclosure, the first information may also be called the second information, and similarly, the second information may also be called the first information. Depending on the context, the word "if" as used herein may be interpreted as "while" or "when" or "in response to determining".

Figure 1:
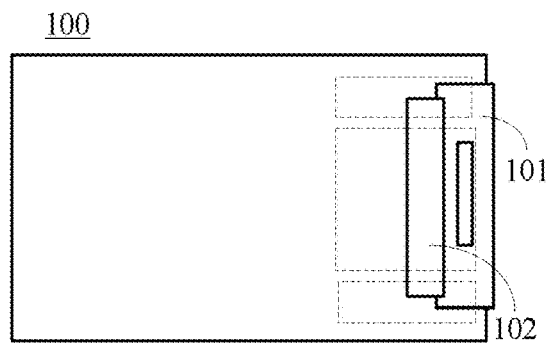
FIG. 1 is prior art and a top view of an electronic device in the related art.
Figure 2:
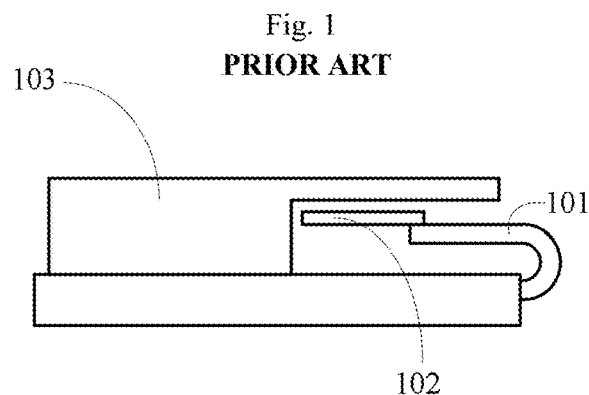
FIG. 2 is prior art and a partial cross-sectional view of the electronic device in FIG. 1.

As shown in FIG. 1 and FIG. 2, in a conventional foldable device 100, a support plate 103 is arranged at a side of a display screen to support the display screen, so as to enhance the strength of the display screen, and a flexible printed circuit (FPC) 102 and a Chip on PI (COP) IC 101 of the screen are arranged under a local portion of the support plate 103. Since the FPC and the COP need to occupy space, and the FPC extends towards the support plate 103 in a horizontal direction in FIG. 2, which needs to occupy a large area, a large region of the display screen cannot be supported by the support plate 103, and the strength of the display screen is weakened.

Figure 3:
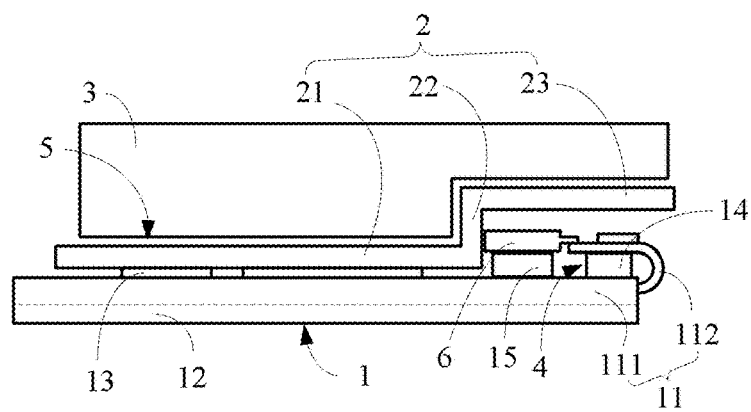
FIG. 3 is a partial cross-sectional view of an electronic device according to an illustrative embodiment.

To this end, as shown in FIG. 3, the present disclosure provides an electronic device 200, and the electronic device 200 may include a display screen 1, a first support plate 2 and a stepped battery 3. The display screen 1 may include an array substrate 11 and a display layer 12, and the display layer 12 is arranged on a surface of the array substrate 11. The array substrate 11 may include a substrate element and a thin film transistor layer, and the substrate element may be a flexible substrate element. The array substrate 11 includes a substrate body 111 and a bent part 112 connected with a first side surface of the substrate body 111. The substrate body 111 may be connected to the display layer 12, and the display layer 12 is supported and protected by the substrate body 111. The bent part 112 is located at an outer side relative to the substrate body 111, so that the bent part 112 may bend towards a non-display side of the display screen 1 and wrap an edge of the first side surface of the substrate body 111.

The first support plate 2 is connected with the substrate body 111. As shown in FIG. 3, the first support plate 2 may be bonded and fixed with the substrate body 111 by a first adhesive 13, and the first support plate 2 fixed to the substrate body 111 may define an open first accommodating cavity 4 together with the substrate body 111. The bent part 112 may extend into the first accommodating cavity 4 after being bent and wrapping the edge (for example, an upper edge in FIGS. 3 and 5) of the first side surface of the substrate body 111, so that a portion of the bent part 112 may be located in the first accommodating cavity 4. Furthermore, as shown in FIG. 3, a height difference between a portion of the bent part 112 parallel to the substrate body 111 after being bent and the substrate body 111 is determined by a bending radius of the bent part 112, and in order to fix the bent part 112, the portion of the bent part 112 parallel to the substrate body 111 may be bonded to a second side surface (which is connected with and perpendicular to the first side surface) of the substrate body 111 facing away from a display side of the display screen 1 by a second adhesive 14. When the bending radius is large and it is difficult for a thickness of the second adhesive 14 to meet a gap between the substrate body 111 and the bent part 112, a spacer may be arranged, and a size of the spacer may be designed as required.

Figure 4:
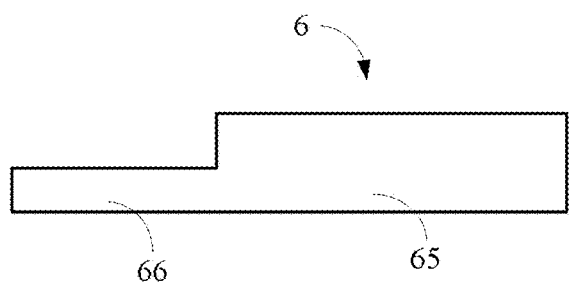
FIG. 4 is a cross-sectional view of a flexible circuit board according to an illustrative embodiment.

The electronic device 200 may further include a flexible circuit board 6, and the flexible circuit board 6 is arranged in the first accommodating cavity 4, and connected with and in conduction with the bent part 112. The flexible circuit board 6 may be bonded to the second side surface of the substrate body 111 facing away from the display side by a third adhesive 15. An area occupied by the flexible circuit board 6 in the first accommodating cavity 4 will directly affect a volume of the first accommodating cavity 4, and further affect a contact area between the first support plate 2 and the display screen 1. Therefore, as shown in FIG. 4, it is also proposed in the present disclosure that the flexible circuit board 6 may include a plurality of layered regions, and the number of wiring layers in each layered region is different from those in other layered regions. For example, as shown in FIG. 4, the flexible circuit board 6 may include a first layered region 65 and a second layered region 66, the first layered region 65 may have a double wiring layers and the second layered region 66 may have a single wiring layer. Based on this, by increasing the number of local wiring layers of the flexible circuit board 6 to increase a thickness of the flexible circuit board 6, a width of the flexible circuit board 6 can be reduced, so that a size of the first accommodating cavity 4 in a horizontal direction in FIG. 3 can be reduced. Further, increasing the thickness of the flexible circuit board 6 can take advantage of the fact that the flexible circuit board 6 itself is in the first accommodating cavity 4, without increasing a size of the first accommodating cavity 4 in a vertical direction in FIG. 3, so that the overall volume of the first accommodating cavity 4 is reduced, which is beneficial to increasing the contact area between the first support plate 2 and the display screen 1, thereby increasing the strength of the display screen 1.

Of course, in the embodiment shown in FIG. 4, an example in which the flexible circuit board 6 includes two layered regions is taken for explanations. Actually, in other embodiments, the flexible circuit board 6 may also include three or more layered regions, which is not limited by the present disclosure. In the embodiment shown in FIG. 4, an example in which the first layered region 65 includes the double wiring layers and the second layered region 66 includes the single wiring layer is taken for explanations. In other embodiments, the first layered region 65 may also include multiple wiring layers, such as four wiring layers, six wiring layers or more, and the second layered region 66 may also include the double wiring layers, so long as the number of wiring layers in the second layered region 66 is different from that of the first layered region 65. Likewise, when the flexible circuit board 6 includes three or more layers, each layered region may include the single wiring layer or the multiple wiring layer, as long as the number of wiring layers in this layered region is different from the numbers of wiring layers in other layered regions.

According to the current development trend, in order to occupy a favorable market, major manufacturers are considering upgrading the configuration of mainstream flagship models, so it is necessary to configure more and larger components inside the device, which loses the thickness advantage of the device. In particular, for the current mainstream foldable models, due to the large screen, the power consumption is significantly increased, so that, in order to improve the endurance capacity of the foldable device, it is necessary to configure a relatively thick and heavy battery in the device. As shown in FIG. 1 and FIG. 2, the battery is arranged above the support plate 103, and its side adjacent to the support plate 103 is flat, so that the space utilization rate is not good, and the battery capacity cannot be optimized to a greater extent to improve the endurance capacity of the device.

Figure 5:
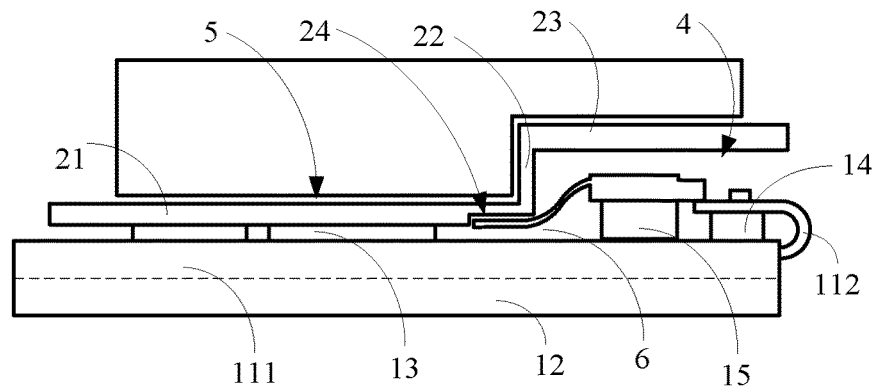
FIG. 5 is a partial cross-sectional view of another electronic device according to an illustrative embodiment.

Therefore, as shown in FIG. 5, the first support plate 2 may further include a first avoidance part 24 recessed from a surface facing the substrate body 111, and at least part of at least one of the multiple layered regions included in the flexible circuit board 6 is arranged in the first avoidance part 24, so that the size of the flexible circuit board 6 in the horizontal direction in FIG. 5 can be further reduced, the volume of the first accommodating cavity 4 can be reduced, and the contact area between the first support plate 2 and the display screen 1 can be increased. Specifically, a layered region with fewer layers of the flexible circuit board 6 is arranged in the first avoidance part 24, so that the requirement for a volume of the first avoidance part 24 can be reduced, and the strength of the first support plate 2 can be ensured, so as not to affect the support performance of the first support plate 2. The first avoidance part 24 may include an avoidance groove or a hollow groove, and may be processed and designed according to requirements, which is not limited by the present disclosure. For the part of the flexible circuit board 6 arranged in the first avoidance part 24, it may also be bonded to the second side surface of the substrate body 111 facing away from the display side by an adhesive.

Figure 6:
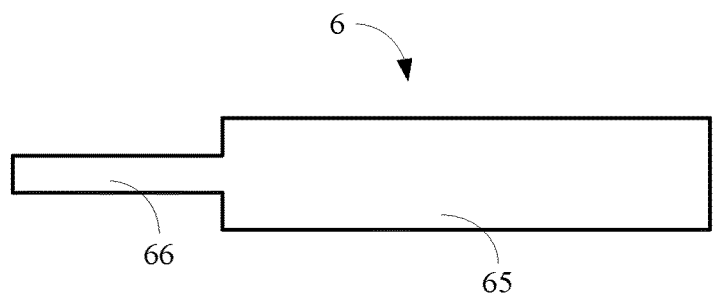
FIG. 6 is a cross-sectional view of another flexible circuit board according to an illustrative embodiment.
Figure 7:
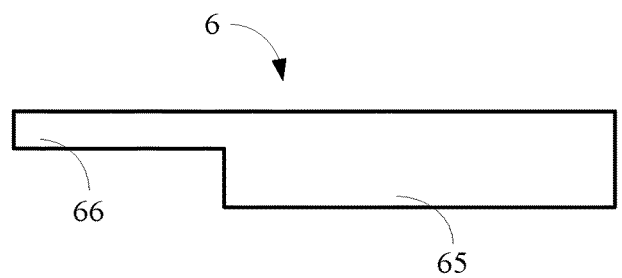
FIG. 7 is a cross-sectional view of yet another flexible circuit board according to an illustrative embodiment.

Taking the embodiment shown in FIG. 5 as an example, a thin layered region of the flexible circuit board 6 extends into the first avoidance part 24. For the flexible circuit board 6, as shown in FIG. 4, in a thickness direction of the flexible circuit board 6, the relatively thin layered region of the flexible circuit board 6 will be located at a bottom of the flexible circuit board 6 adjacent to the substrate body 111, or as shown in FIG. 6, in the thickness direction of the flexible circuit board 6, the relatively thin layered region of the flexible circuit board 6 will be located in middle of the flexible circuit board 6 and extends outwards, or as shown in FIG. 7, in the thickness direction of the flexible circuit board 6, the relatively thin layered region of the flexible circuit board 6 will be located at a top of the flexible circuit board 6 facing away from the substrate body 111, which may be designed as required.

In the above embodiments, as shown in FIGS. 3 and 5, the first support plate 2 may include a support body 21, a transition part 22 and a step part 23. One end of the transition part 22 is connected with the support body 21 and the other end of the transition part 22 is connected with the step part 23. The support body 21 and the step part 23 are spaced apart from each other by a preset distance in a thickness direction of the electronic device 200, and the preset distance is equal to a height of the transition part 22 in the thickness direction of the electronic device 200. The support body 21 may be connected to a side surface (i.e., the second side surface connected with and perpendicular to the first side surface) of the substrate body 111 facing away from the display layer 12, and the strength of the display screen 1 is further improved by the support body 21. A side surface of the transition part 22, a side surface of the step part 23 and a part of the substrate body 111 may define the first accommodating cavity 4, and the bent part 112 may extend into the first accommodating cavity 4 after being bent and wrapping the edge of the first side surface of the substrate body 111, so that the portion of the bent part 112 may be located in the first accommodating cavity 4. Further, since the transition part 22 extends along the thickness direction of the electronic device 200, the support body 21 and the step part 23 have a height difference therebetween, so that another opposite side surface of the transition part 22, another opposite side surface of the step part 23 and the support body 21 may cooperate to define a second accommodating cavity 5, and the stepped battery 3 may be arranged on a side surface of the first support plate 2 facing away from the display screen 1, and partially arranged in the second accommodating cavity 5.

Based on this, since the stepped battery 3 may be partially arranged in the second accommodating cavity 5, the volume of the stepped battery 3 can be increased, the capacity of the stepped battery 3 can be improved, and the endurance time of the electronic device 200 can be prolonged. In the present disclosure, an example in which no frames are arranged on both sides of the second accommodating cavity 5 is taken. In fact, in other embodiments, the second accommodating cavity 5 may also have a shape of a groove, and this is not limited in the present disclosure. In particular, through the solutions in the embodiments shown in FIGS. 3 and 5, after decreasing the width of the flexible circuit board 6 and the volume of the first accommodating cavity 4, the transition part 22 of the first support plate 2 can be arranged more adjacent to the bent part 112, so that the volume of the second accommodating cavity 5 can be increased, which is beneficial to further improving the capacity of the stepped battery 3.

Figure 8:
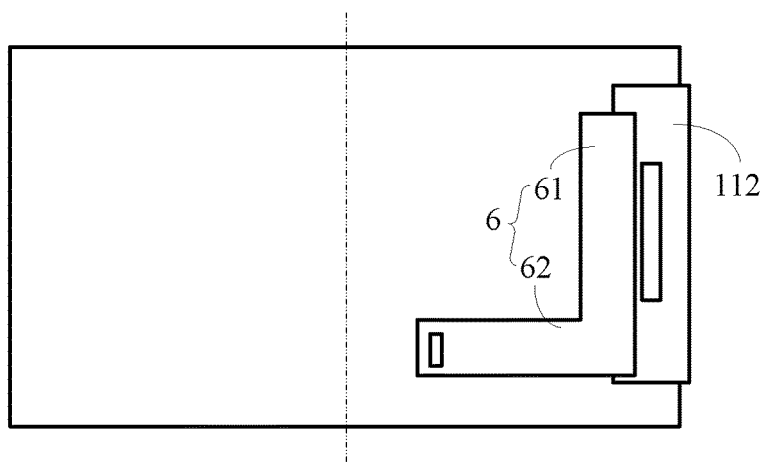
FIG. 8 is a first top view of an electronic device according to an illustrative embodiment.

As shown in FIG. 8, the edge of the first side surface of the substrate body 111 is arranged in a first direction, that is, in a vertical direction in FIG. 8; the electronic device 200 may further include a flexible circuit board 6, the flexible circuit board 6 may include a main circuit region 61 and a first lead-out region 62, the main circuit region 61 is arranged in the first direction, and is connected with and in conduction with the bent part 112, the first lead-out region 62 is connected with and in conduction with the main circuit region 61, and the first lead-out region 62 may be bent relative to the main circuit region 61 due to the limited space in the first direction. The first lead-out region 62 may be provided with a wiring portion to be connected with and in conduction with other electronic components, so as to output signals of the display screen 1. Of course, related components, such as a capacitor, an inductor, a current circuit and a driving chip, may also be arranged on the first lead-out region 62. The first direction is an extension direction of the edge of the first side surface, that is, the vertical direction in FIG. 5. The first lead-out region 62 may be bent perpendicularly relative to the main circuit region 61 as shown in FIG. 8, or may be bent to form an acute angle or an obtuse angle, which may be designed as required, and is mot limited by the present disclosure.

Figure 9:
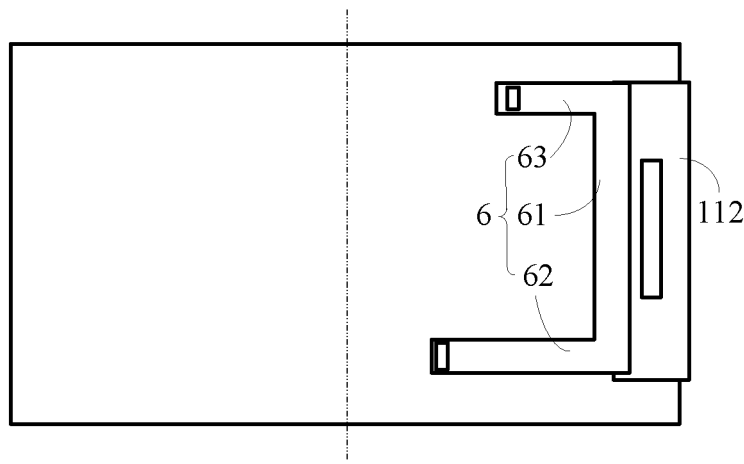
FIG. 9 is a second top view of an electronic device according to an illustrative embodiment.

In another embodiment, as shown in FIG. 9, the edge of the first side surface of the substrate body 111 is arranged in a first direction, that is, in a vertical direction in FIG. 9. The flexible circuit board 6 may include a main circuit region 61, a first lead-out region 62 and a second lead-out region 63. Like the previous embodiment, the main circuit region 61 is arranged in the first direction, and is connected with and in conduction with the bent part 112. The first lead-out region 62 is connected with and in conduction with one end of the main circuit region 61, and the second lead-out region 63 is connected with and in conduction with the other end of the main circuit region 61. Of course, if the space in the first direction is limited, at least one of the first lead-out region 62 and the second lead-out region 63 may be bent relative to the main circuit region 61. Specifically, it may be bent to form an acute angle, an obtuse angle or a right angle. The first lead-out region 62 and the second lead-out region 63 each may be provided with a wiring portion to output signals of the display screen 1. Compared with the embodiment shown in FIG. 8, in the embodiment shown in FIG. 9, a signal of the main circuit region 61 may be divided into two paths, which is equivalent to that a width of the main circuit region 61 required for wiring in FIG. 8 is divided into two paths. Therefore, a width of the main circuit region 61 in FIG. 9 can be reduced, thus contributing to an arrangement position of the transition part 22, and further increasing the volume of the second accommodating cavity 5, which is beneficial to improving the capacity of the stepped battery 3.

Figure 10:
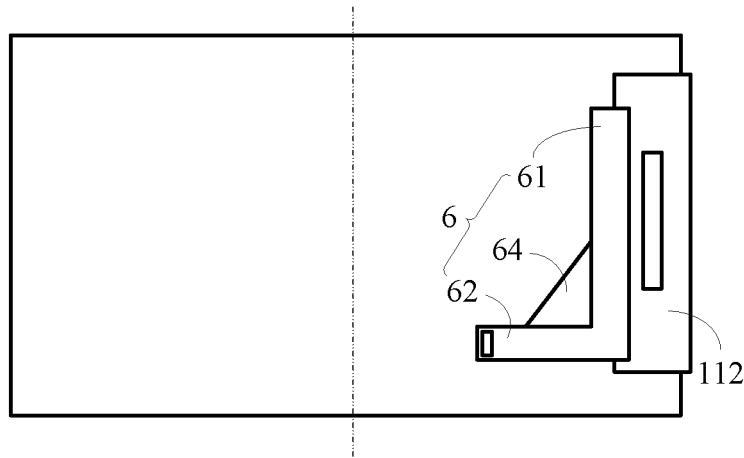
FIG. 10 is a third top view of an electronic device according to an illustrative embodiment.

In some other embodiments, as shown in FIG. 10, the flexible circuit board 6 may include a main circuit region 61, a first lead-out region 62 and a widening region 64. Similar to the embodiment of FIG. 8, the main circuit region 61 is arranged in the first direction, and is connected with and in conduction with the bent part 112, and the first lead-out region 62 is connected with and in conduction with the main circuit region 61. If the space in the first direction is limited, the first lead-out region 62 may be bent relative to the main circuit region 61. Specifically, it may be bent to form an acute angle, an obtuse angle or a right angle. The first lead-out region 62 may be provided with a wiring portion for connection and conduction with other electronic components, so as to output signals of the display layer 12. Of course, related components, such as a capacitor, an inductor, a current circuit and a driving chip, may also be arranged on the first lead-out region 62. It may be understood that when the wiring of the main circuit region 61 needs to be bent and arranged to the first lead-out region 62, the wiring bottleneck is likely to occur at the corner due to the stacking of wires, so the widening region 64 is located at a corner area formed by the first lead-out region 62 and the main circuit region 61, to increase the region available for wiring. The number of layers of the widening region 64 may be the same as or different from those of the main circuit region 61 and the first lead-out region 62. In the embodiment shown in FIG. 10, an example in which the widening region 64 has a triangle shape is taken for explanations. In fact, the widening region 64 may also have a rectangle shape or other irregular shapes, such as an arc widening region, which may be designed as required, and this is not limited by the present disclosure.

In the above embodiments, the division of the layered regions of the flexible circuit board 6 and the division of the main circuit region 61, the first lead-out region 62 and the second lead-out region 63 of the flexible circuit board 6 are performed from different dimensions. In fact, the main circuit region 61 may have a plurality of layered regions, and the same layered region may be partially located in the main circuit region 61 and partially located in the first lead-out region 62, which is not limited by the present disclosure.

Figure 11:
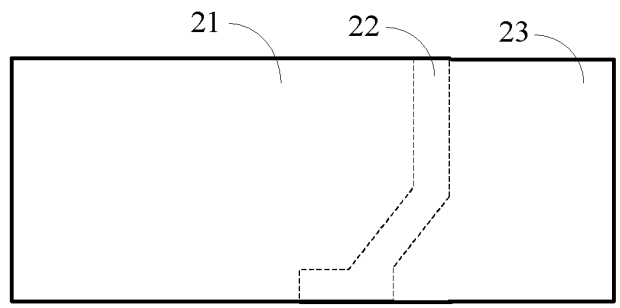
FIG. 11 is a top view of a first support plate according to an illustrative embodiment.
Figure 12:
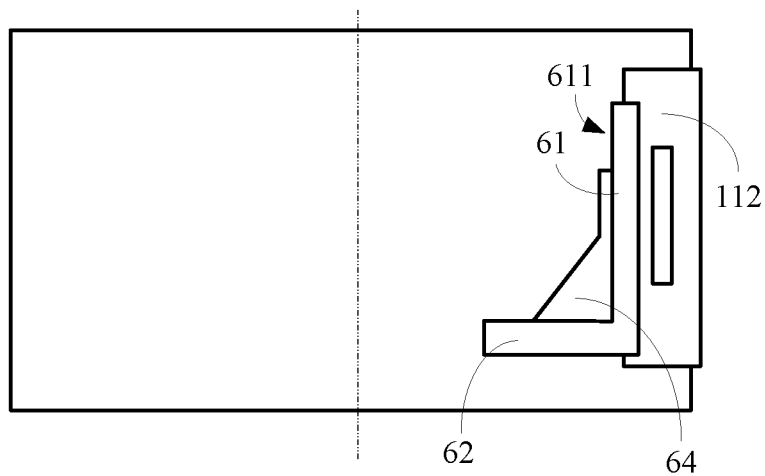
FIG. 12 is a fourth top view of yet another electronic device according to an illustrative embodiment.

In the above embodiments of FIGS. 8-10, a shape of a side surface of the flexible circuit board 6 facing away from the first side surface varies, and thus a shape of the transition part 22 in each embodiment may be adapted. For example, the shape of the transition part 22 of the first support plate 2 shown in FIG. 11 matches with the shape of the side surface of the flexible circuit board 6 facing away from the first side surface shown in FIG. 10, and the stepped battery 3 may also be subsequently designed to have an irregular shape in an adaptive manner, so as to make full use of everywhere in the second accommodating cavity 5, thus improving the capacity of the stepped battery 3. In the above embodiments, as shown in FIG. 12, the main circuit region 61 includes a depression 611, which may be formed by depressing the side surface of the main circuit region 61 facing away from the first side surface (or, the bent part 112) towards another opposite side surface of the main circuit region 61 (i.e. facing the first side surface or the bent part 112). Through this depression 611, the space can be made for the transition part 22, which is beneficial to the subsequent volume expansion of the second accommodating cavity 5 and the subsequent capacity expansion of the stepped battery 3. In the embodiment shown in FIG. 12, an example in which the main circuit region 61 includes a single depression 611 is taken for explanations. In other embodiments, the main circuit region 61 may also include a plurality of depressions 611, and the transition part 22 may also be designed in the adaptive manner, which will not be described in detail here.

Figure 13:
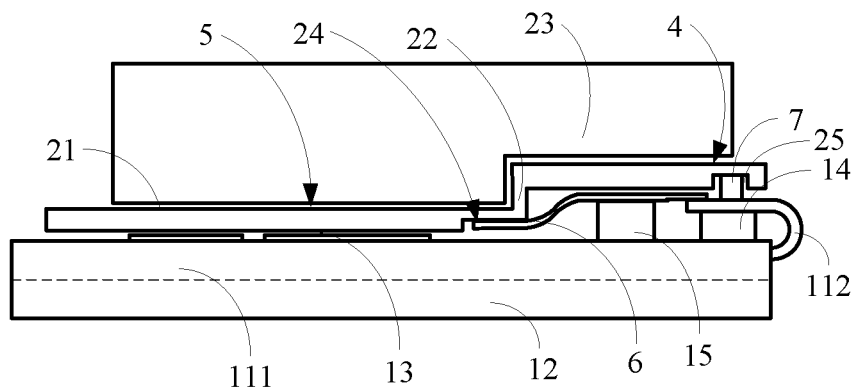
FIG. 13 is a partial cross-sectional view of still another electronic device according to an illustrative embodiment.

As shown in FIG. 13, the first support plate 2 may further include a second avoidance part 25 in communication with the first accommodating cavity 4, the electronic device 200 may further include a chip assembly 7, the chip assembly 7 may be arranged on the surface of the bent part 112 facing away from the substrate body 111, and the related signals of the display screen 1 may be output through the chip assembly 7. Moreover, in order to protect the chip assembly 7, the chip assembly 7 may be at least partially located in the second avoidance part 25, which can reduce an impact on the chip assembly 7 when an external force is exerted. Of course, if there is another structural member between the first support plate 2 and the chip assembly 7, such as an insulating cover, a corresponding through groove may be formed in the structural member.

Figure 14:
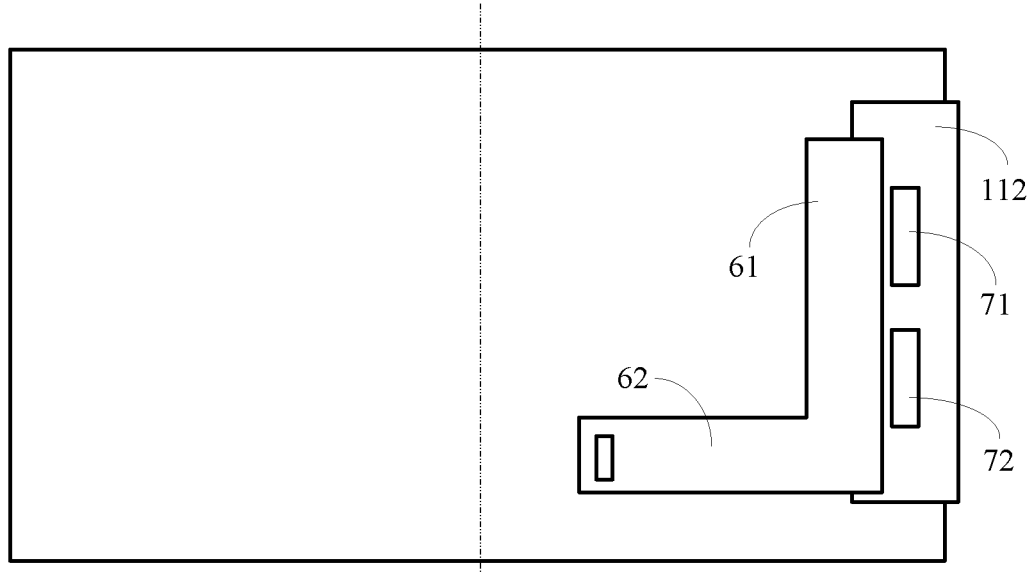
FIG. 14 is a fifth top view of a further electronic device according to an illustrative embodiment.

The chip assembly 7 may include a single chip, or as shown in FIG. 14, the chip assembly 7 may include a first chip 71 and a second chip 72, both of which are arranged in the region of the bent part 112 parallel to the substrate body 111, and are in conduction with the bent part 112, respectively. Through the first chip 71 and the second chip 72, the related signals of the thin film transistor layer of the display screen 1 can be collected and further output through the flexible circuit board 6. Compared with a single chip in the related art, arranging two chips can reduce the requirements on the processing resources of the chips. In combination with the embodiment of FIG. 11, at least one of the first chip 71 and the second chip 72 may be arranged in the second avoidance part 25 of the first support plate 2.

Figure 15:
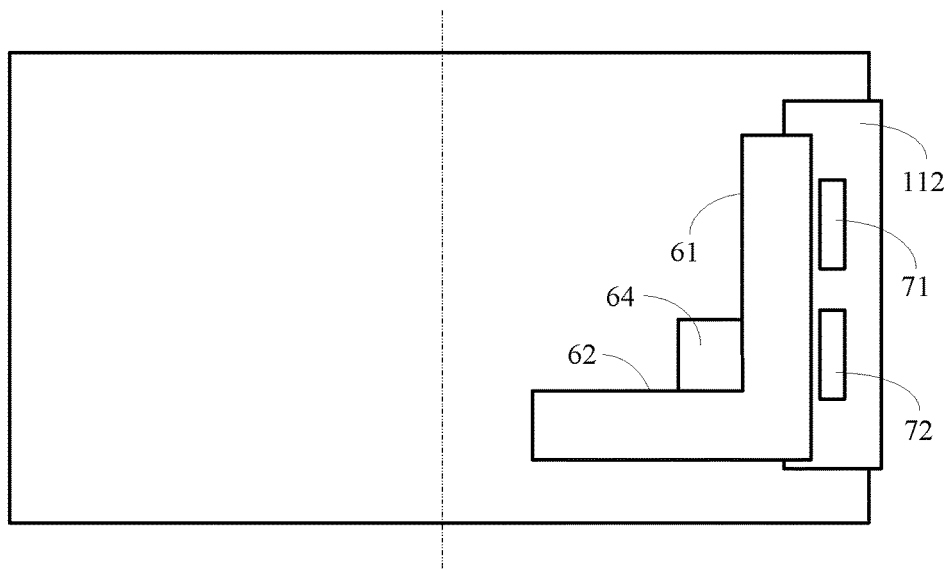
FIG. 15 is a sixth top view of a further electronic device according to an illustrative embodiment.

As also shown in FIG. 14, the first chip 71 and the second chip 72 may be symmetrically arranged with respect to a center line of the bent part 112, and an extension direction of the center line is perpendicular to the first side surface (specifically, the edge of the first side surface), which is vertically arranged in FIG. 14, so that the center line of the bent part 112 is horizontally arranged in FIG. 14. By symmetrically arranging the first chip 71 and the second chip 72, it is convenient for the signals output by the thin film transistor layer to be shunted by the two chips, and the electrical connection between the two chips and the bent part 112 can also be simplified. In the embodiment shown in FIG. 12, an example in which the flexible circuit board 6 does not have the widening region at the corner area of the main circuit region 61 and the first lead-out region 62 is taken for explanations. In fact, as shown in FIG. 15, the flexible circuit board 6 may also have the widening region 64 at the corner area of the main circuit region 61 and the first lead-out region 62, and also the chip assembly 7 may include the first chip 71 and the second chip 72. The number of layers of the widening region 64 may be the same as or different from those of the main circuit region 61 and the first lead-out region 62.

Figure 16:
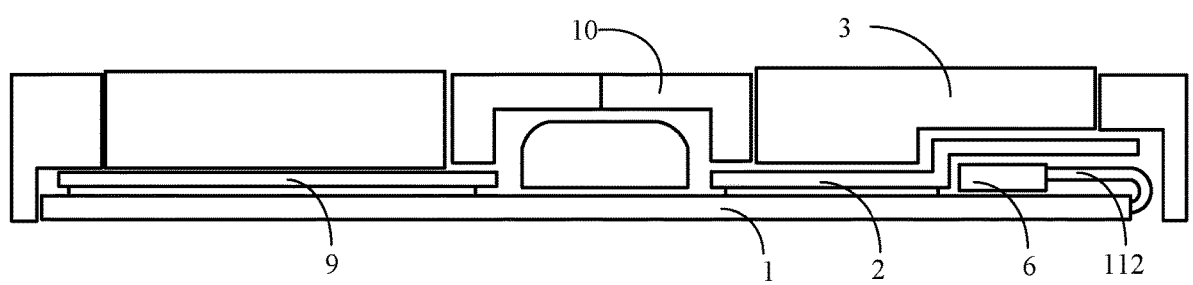
FIG. 16 is a cross-sectional view of an electronic device according to an illustrative embodiment.

Based on the above embodiments, the electronic device 200 may be a device with the screen on a single side, or as shown in FIG. 16, the electronic device 200 may be a foldable device. The electronic device 200 may also include a second support plate 9 and a rotating shaft 10, the second support plate 9 is connected to the second side surface of the substrate body 111 facing away from the display layer 12, the second support plate 9 is also connected to one side of the rotating shaft 10, and the first support plate 2 is connected to the other side of the rotating shaft 10. Subsequently, the second support plate 9 and the first support plate 2 can move close to each other or away from each other through the rotation of the rotating shaft 10, so that the electronic device 200 can be switched between a folded state and an unfolded state.

In the above embodiments, the bent part 112 is bent to wrap the edge of the first side surface of the substrate body 111 adjacent to the first support plate 2, and the second support plate 9 is arranged in a flat shape. In fact, in other embodiments, the related circuits of the array substrate 11 may also be led out from a side where the second support plate 9 is, and similarly, a bent part may also be provided. The subsequent battery arrangement and the subsequent related circuit board arrangement on the side corresponding to the second support plate 9 may refer to the previous embodiments, and will not be described in detail here.

Other embodiments of the present disclosure will easily occur to those skilled in the art after considering the specification and practicing the disclosure disclosed herein. The present disclosure is intended to cover any variations, uses or adaptations of the present disclosure, which follow the general principle of the present disclosure and include the common sense or common technical means in the related art that are not disclosed in the present disclosure. The specification and embodiments are to be regarded as illustrative only, while the true scope and spirit of the present disclosure are indicated by the following claims.

It should be understood that the present disclosure is not limited to the precise structure described above and shown in the drawings, and various modifications and changes can be made without departing from the scope of the present disclosure. The scope of the present disclosure is limited only by the appended claims.

What is claimed is:

1. An electronic device, comprising:
   a display screen comprising an array substrate, the array substrate comprising a substrate body and a bent part connected with a first side surface of the substrate body, and the bent part being bent towards a non-display side of the display screen;
   a first support plate connected with the substrate body and cooperating with a part of the substrate body to define a first accommodating cavity, and the bent part being partially located in the first accommodating cavity; and
   a flexible circuit board arranged in the first accommodating cavity, connected with and in conduction with the bent part, and comprising a plurality of layered regions, and a first number of wiring layers in a first layered region being different from other number of wiring layers in other layered regions;
   wherein the first support plate comprises a support body, a transition part and a step part, the transition part connects the support body with the step part, and the support body and the step part are spaced apart by a preset height in a thickness direction of the electronic device;
   the support body is connected with the substrate body, one side surface of the step part, one side surface of the transition part and the part of the substrate body define the first accommodating cavity, and another opposite side surface of the step part, another opposite side surface of the transition part and the support body define a second accommodating cavity; and
   the electronic device further comprises a stepped battery arranged on a side surface of the first support plate facing away from the display screen, and the stepped battery is partially arranged in the second accommodating cavity.

2. The electronic device according to claim 1, wherein the first support plate further comprises a first avoidance part recessed from a surface facing the substrate body; and
   at least a part of at least one of the plurality of layered regions is arranged in the first avoidance part.

3. The electronic device according to claim 2, wherein the first avoidance part comprises at least one of an avoidance groove or a hollow groove.

4. The electronic device according to claim 1, wherein the bent part wraps an edge of the first side surface, the edge of the first side surface is arranged along a first direction, and the flexible circuit board comprises:
   a main circuit region arranged along the first direction, connected with and in conduction with the bent part;
   a first lead-out region connected to one end of the main circuit region; and
   a second lead-out region connected to another end of the main circuit region.

5. The electronic device according to claim 1, wherein the bent part wraps an edge of the first side surface, the edge of the first side surface is arranged along a first direction, and the flexible circuit board comprises:
   a main circuit region arranged along the first direction, connected with and in conduction with the bent part;
   a first lead-out region connected to an end of the main circuit region and bent relative to the main circuit region; and
   a widening region located at a corner area formed by the first lead-out region and the main circuit region.

6. The electronic device according to claim 4, wherein the main circuit region comprises one or more depressions, and the one or more depressions are depressed from a side surface of the main circuit region facing away from the bent part towards another opposite side surface of the main circuit region.

7. The electronic device according to claim 5, wherein the main circuit region comprises one or more depressions, and the one or more depressions are depressed from a side surface of the main circuit region facing away from the bent part towards another opposite side surface of the main circuit region.

8. The electronic device according to claim 4, wherein the first lead-out region is arranged perpendicularly to the main circuit region.

9. The electronic device according to claim 5, wherein the first lead-out region is arranged perpendicularly to the main circuit region.

10. The electronic device according to claim 4, wherein the first support plate matches in shape with a side surface of the flexible circuit board facing away from the bent part.

11. The electronic device according to claim 5, wherein the first support plate matches in shape with a side surface of the flexible circuit board facing away from the bent part.

12. The electronic device according to claim 1, wherein the first support plate comprises a second avoidance part in communication with the first accommodating cavity; and
    the electronic device further comprises a chip assembly, the chip assembly is arranged on a surface of the bent part facing away from the substrate body, and the chip assembly is at least partially located in the second avoidance part.

13. The electronic device according to claim 1, wherein the electronic device further comprises a chip assembly, the chip assembly comprises a first chip and a second chip, and both the first chip and the second chip are arranged on a portion of the bent part parallel to the substrate body.

14. The electronic device according to claim 13, wherein the first chip and the second chip are symmetrically arranged relative to a center line of the bent part, and an extension direction of the center line is perpendicular to the first side surface.

15. The electronic device according to claim 1, further comprising:
    a second support plate connected with the substrate body; and
    a rotating shaft,
    wherein the second support plate is connected to one side of the rotating shaft, and the first support plate is connected to the other side of the rotating shaft; and
    the second support plate and the first support plate are configured to move close to or away from each other along with rotation of the rotating shaft, to allow the electronic device to be switched between an unfolded state and a folded state.

* * * * *